United States Patent
Bao et al.

(10) Patent No.: US 8,736,020 B2
(45) Date of Patent: May 27, 2014

(54) ELECTRONIC ANTI-FUSE

(75) Inventors: Junjing Bao, Cedar Grove, NJ (US); Griselda Bonilla, Fishkill, NY (US); Samuel S. Choi, Beacon, NY (US); Ronald G. Filippi, Wappingers Falls, NY (US); Naftali Eliahu Lustig, Croton on Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/608,183

(22) Filed: Sep. 10, 2012

(65) Prior Publication Data

US 2014/0070363 A1  Mar. 13, 2014

(51) Int. Cl.
*H01L 23/52* (2006.01)

(52) U.S. Cl.
USPC .......................................... 257/530; 438/131

(58) Field of Classification Search
USPC ........... 257/529, 530; 438/131, 600, 637, 638
See application file for complete search history.

(56) References Cited

U.S. PATENT DOCUMENTS

| | | | |
|---|---|---|---|
| 5,404,029 | A | 4/1995 | Husher et al. |
| 5,625,219 | A | 4/1997 | Takagi |
| 5,789,796 | A | 8/1998 | Kang et al. |
| 6,008,716 | A | 12/1999 | Kokubun |
| 6,124,194 | A | 9/2000 | Shao et al. |
| 6,251,710 | B1 * | 6/2001 | Radens et al. ............... 438/131 |
| 6,825,489 | B2 | 11/2004 | Kozicki |
| 7,402,463 | B2 | 7/2008 | Yang et al. |
| 7,450,431 | B1 | 11/2008 | Karp et al. |
| 7,572,682 | B2 | 8/2009 | Yang et al. |

OTHER PUBLICATIONS

Pending U.S. Appl. No. 13/475,542, filed May 18, 2012, "Anti-Fuse Structure and Fabrication".

* cited by examiner

*Primary Examiner* — Yu-Hsi D Sun
*Assistant Examiner* — Christina Sylvia
(74) *Attorney, Agent, or Firm* — L. Jeffrey Kelly; Catherine Ivers

(57) ABSTRACT

An electronic anti-fuse structure, the structure including an $M_x$ level comprising a first $M_x$ metal and a second $M_x$ metal, a dielectric layer located above the $M_x$ level, an $M_{x+1}$ level located above the dielectric layer; and a metallic element in the dielectric layer and positioned between the first $M_x$ metal and the second $M_x$ metal, wherein the metallic element is insulated from both the first $M_x$ metal and the second $M_x$ metal.

18 Claims, 10 Drawing Sheets

US 8,736,020 B2

ELECTRONIC ANTI-FUSE

BACKGROUND

1. Field of the Invention

The present invention relates generally to semiconductors, and, more particularly, to anti-fuse structures.

2. Background of Invention

A fuse is a structure that is normally "on" meaning that current is flowing, but once "programmed" it is "off" meaning that current does not flow. In a fuse, programming means applying a suitable voltage so that the fuse "blows" to create an open circuit or high resistance state. An anti-fuse is a structure that is normally "off" meaning that no current flows, but once "programmed" it is "on" meaning that current does flow. In an anti-fuse, programming means applying a suitable voltage to two electrodes and forming a conductive link between them to close the circuit. In integrated circuitry memory devices, fuses and anti-fuses can be used for activating redundancy in memory chips and for programming functions and codes in logic chips. Specifically, dynamic random access memory (DRAM) and static random access memory (SRAM) may use fuses and anti-fuses for such purposes. In addition, fuses and anti-fuses can also be used to prevent decreased chip yield caused by random defects generated in the manufacturing process. Moreover, fuses and anti-fuses provide for future customization of a standardized chip design. For example, fuses and anti-fuses may provide for a variety of voltage options, packaging pin out options, or any other options desired by the manufacturer to be employed prior to the final processing. These customization possibilities make it easier to use one basic design for several different end products and help increase chip yield.

Both fuse and anti-fuse elements are essential for advanced DRAM applications, and it may be advantageous to (1) integrate the two elements into a single chip (2) that operates at normal on-chip or readily available voltages. As depicted in FIGS. 1A and 1B, existing anti-fuse structures, for example structure 100, have an anti-fuse layer 110 sandwiched between two "disconnected" conductive materials 102, 104. Fabricating the anti-fuse structure 100 requires the addition of the anti-fuse layer 110, which may increase overall fabrication complexity and costs. The anti-fuse structure 100 requires that the bulk thickness of the anti-fuse layer 110 be breached to form a conductive link 112. Because the bulk thickness of the anti-fuse layer 110 must be breached, a high programming voltage may be required to completely form the link 112 between the two conductive materials 102, 104, the thickness uniformity of the anti-fuse layer 110 directly affects the breakdown voltage and therefore the programming voltage. The thickness uniformity of the anti-fuse layer 110 may vary due to normal process (etch or deposition) uniformity. Because of typical variations in the thickness of the anti-fuse layer 110 the programming voltage may vary between anti-fuse structures on the same chip. Thus, due to thickness variations, an applied voltage may form a conductive link in thinner anti-fuse layers whereas the same applied voltage may not form a conductive link in thicker anti-fuse layers. Therefore, there is a programming yield issue with current anti-fuses which require forming a conductive link across an anti-fuse layer.

Moreover, most prior art anti-fuses require programming voltages higher than the chip supply voltage. Thus, there is a need for anti-fuses that can be programmed with, lower, readily available chip supply voltages.

Thus, there is a need for an anti-fuse device that can be easily integrated into typical process flows, operates at chip supply voltages, and may be reliably programmed.

SUMMARY

According to one embodiment of the present invention, an electronic anti-fuse structure is provided. The structure may include an $M_x$ level including a first $M_x$ metal and a second $M_x$ metal, a dielectric layer located above the $M_x$ level, an $M_{x+1}$ level located above the dielectric layer; and a metallic element in the dielectric layer and positioned between the first $M_x$ metal and the second $M_x$ metal, wherein the metallic element is insulated from both the first $M_x$ metal and the second $M_x$ metal.

According to another exemplary embodiment, a method of forming an electronic anti-fuse is provided. The method may include providing an $M_x$ level including a first $M_x$ metal and a second $M_x$ metal, forming a dielectric layer above the $M_x$ level, and forming an $M_{x+1}$ level above the dielectric layer comprising a metallic element positioned between the first $M_x$ metal and the second $M_x$ metal, wherein the metallic element is insulated from both the first $M_x$ metal and the second $M_x$ metal.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIG. 3A depicts an $M_x$ level having a first $M_x$ metal and a second $M_x$ metal according to an exemplary embodiment.

FIG. 3B depicts the formation of a dielectric layer and an $M_{x+1}$ level according to an exemplary embodiment.

FIG. 3C depicts the removal of a portion of the dielectric layer and the $M_{x+1}$ dielectric, subsequent formation of a via Vx, and the final anti-fuse structure prior to programming according to an exemplary embodiment.

FIG. 3D depicts the final anti-fuse structure after programming according to an exemplary embodiment.

FIG. 4A depicts an $M_x$ level having a first $M_x$ metal and a second $M_x$ metal according to an exemplary embodiment.

FIG. 4B depicts the deposition of a dielectric layer and the subsequent removal of a portion of the dielectric layer according to an exemplary embodiment.

FIG. 4C depicts the deposition of a metallic layer according to an exemplary embodiment.

FIG. 4D depicts the removal of a portion of the metallic layer according to an exemplary embodiment.

FIG. 4E depicts the formation of an $M_{x+1}$ level, and the final anti-fuse structure prior to programming according to an exemplary embodiment.

FIG. 4F depicts the final anti-fuse structure after programming according to an exemplary embodiment.

FIG. 5A depicts an $M_x$ level having a first $M_x$ metal and a second $M_x$ metal according to an exemplary embodiment.

FIG. 5B depicts the deposition of a dielectric layer and the subsequent removal of a portion of the dielectric layer according to an exemplary embodiment.

FIG. 5C depicts the deposition of a metallic layer according to an exemplary embodiment.

FIG. 5D depicts the removal of a portion of the metallic layer according to an exemplary embodiment.

FIG. 5E depicts the formation of an $M_{x+1}$ level according to an exemplary embodiment.

FIG. 5F depicts the removal of a portion of the $M_{x+1}$ level, subsequent formation of a via Vx, and the final anti-fuse structure prior to programming according to an exemplary embodiment.

FIG. 5G depicts the final anti-fuse structure after programming according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The invention relates to an anti-fuse structure, and more particularly, an anti-fuse structure containing a metallic layer and/or a via interconnect. In a preferred embodiment, an anti-fuse link is formed at a dielectric interface rather than through a bulk dielectric, thereby providing improved reliability and require lower programming voltage.

Advantageously, the formation of the anti-fuse structure of the present invention can be implemented in front-end-of-line (FEOL) and/or back-end-of-line (BEOL), and is compatible with current process flows. The BEOL may be distinguished from FEOL in that semiconductor devices, for example transistors, may be fabricated in the FEOL while the connections to and between those semiconductor devices may be formed in the BEOL. The present invention allows anti-fuses to be fabricated during normal interconnect process flows, thus advantageously reducing processing costs for manufacturing anti-fuses which are normally fabricated in different process flows.

Figure 1A:
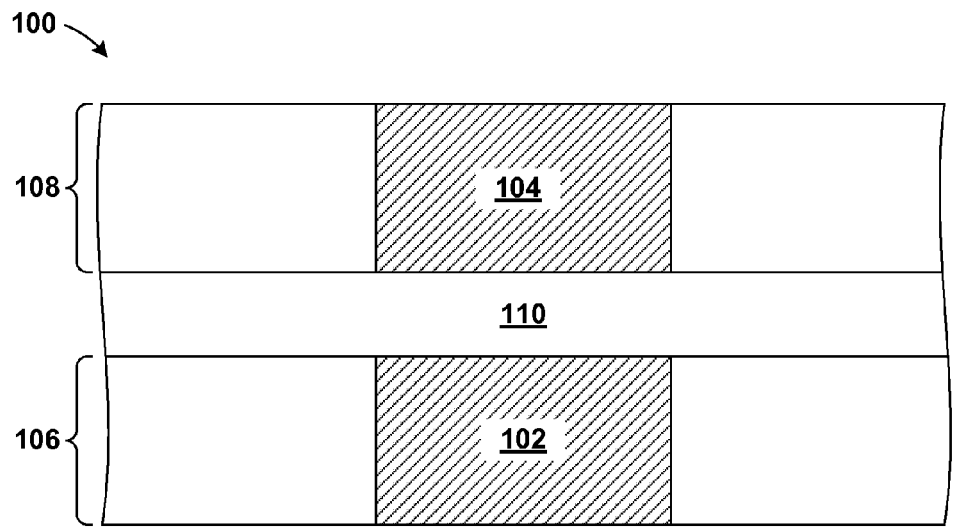
FIG. 1A depicts a cross-sectional view of an anti-fuse structure before programming according to the prior art.
Figure 1B:
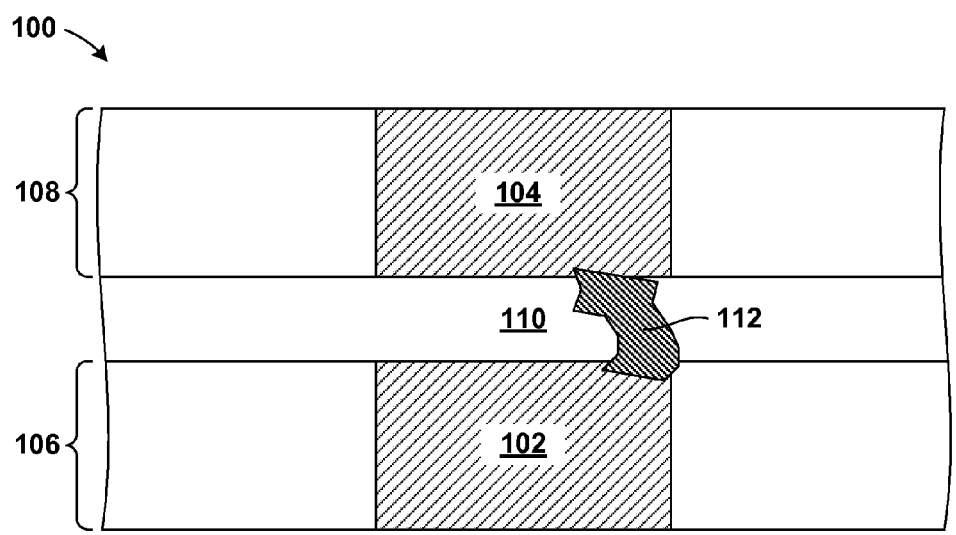
FIG. 1B depicts a cross-sectional view of an anti-fuse structure after programming according to the prior art.
Figure 2A:
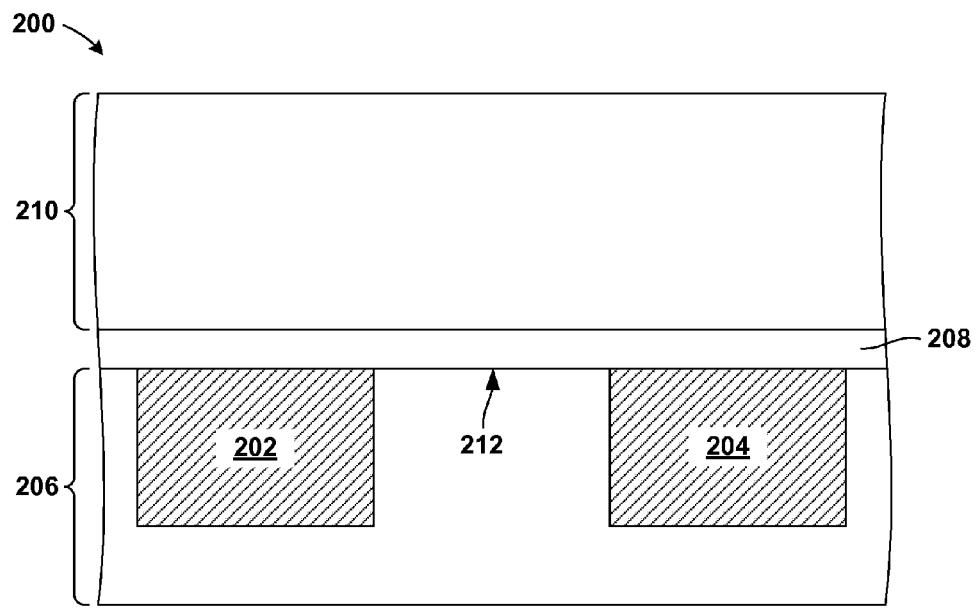
FIG. 2A depicts a cross-sectional view of an anti-fuse structure before programming.

, FIG. 2A illustrates a structure 200 having a different anti-fuse structure than FIG. 1. The structure 200 may include two electrodes 202, 204 embedded in a first inter-level dielectric layer 206. A dielectric layer 208 followed by a second inter-level dielectric layer 210 may be formed above the first inter-level dielectric layer 206. The first and second inter-level dielectric layers 206, 210 and the dielectric layer 208 may include aysilicon containing dielectric material. Preferably, the first inter-level dielectric layer 206 may be made from a different material than the dielectric layer 208 with the dielectric layer 208 typically having a higher dielectric constant than the first inter-level dielectric layer 206. Further, the dielectric layer 208 may include nitrogen while the first inter-level dielectric layer 206 may not. An interface 212 between the first inter-level dielectric layer 206 and the dielectric layer 208 may couple the two electrodes 202, 204 and the path along the interface 212 may be referred to as the breakdown distance. Under typical 22 nm ground rules, the distance between the two electrodes 202, 204 may be about 40 nm; therefore the breakdown distance as measured along the interface 212 may be about 40 nm, however the dimensions will scale accordingly for different technology nodes, and the given dimensions are just examples.

Figure 2B:
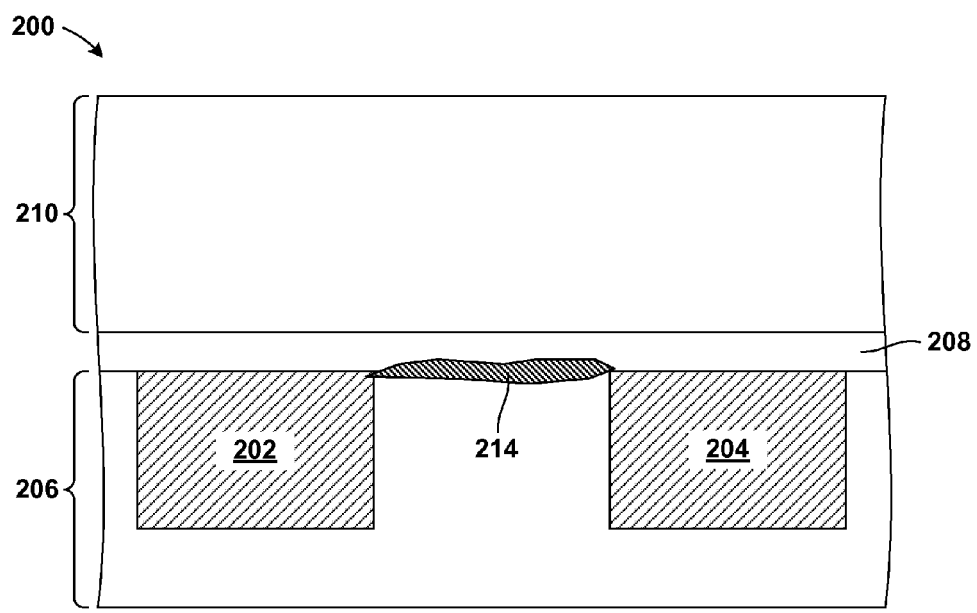
FIG. 2B depicts a cross-sectional view of an anti-fuse structure after programming.

Referring now to FIG. 2B, the structure 200 after programming is shown. Typically, programming the anti-fuse may involve applying a voltage across the two electrodes 202, 204. A failure may occur along the interface 212 (shown in FIG. 2A), and an electrically conductive link 214 may be formed. The failure may occur along the interface 212 (shown in FIG. 2A) because it may be the weakest point between the two electrodes 202, 204. For a given programming voltage, the time necessary to form the conductive link 214 may be dictated by the electric field, which in turn may be proportional to the distance (i.e. the breakdown distance) between the two electrodes 202, 204.

Unlike the structure 100 of FIG. 1A, the dielectric layer 208 of the structure 200 does not have to be breached to form the conductive link 214. Rather, the conductive link 214 may be formed along the interface 212 between the first inter-level dielectric layer 206 and the dielectric layer 208. However, the programming voltage and programming time of the structure 200 of FIG. 2A may be dependant on the breakdown distance which is dependant on fabrication ground rule limitations. Therefore, a structure which provides a known, controllable, sub-ground rule breakdown distance between electrodes is desirable.

Ideally, programming will require a minimal amount of current and a minimal breakdown time. One way to reduce the breakdown time and reduce the required programming current of the anti-fuse structure may be to reduce the effective breakdown distance.

One method by which to reduce the effective breakdown distance is described in detail below by referring to the accompanying drawings FIGS. 3A-3D. It may be understood by a person having ordinary skill in the art that while only two $M_x$ metals are depicted in the following set of drawings a single chip may include more than two $M_x$ metals.

Figure 3A:
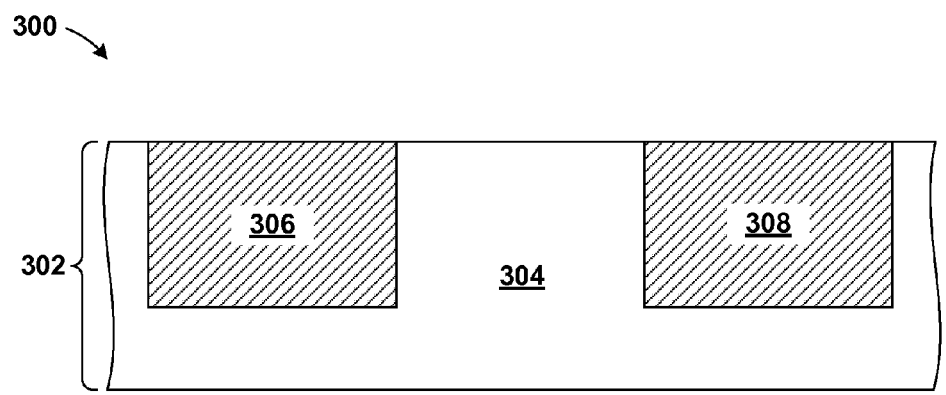
FIGS. 3A-3D illustrate the steps of a method of forming an anti-fuse structure according to an exemplary embodiment.

Referring now to FIG. 3A, a structure 300 is shown. The structure 300 may include an $M_x$ level 302. The $M_x$ level 302 may include an $M_x$ dielectric 304, a first $M_x$ metal 306, and a second $M_x$ metal 308. The $M_x$ dielectric 304 may be, for example, $SiO_2$, $Si_3N_4$, SiCOH, SiLK, or porous dielectrics. The $M_x$ level 302 may be any interconnect level in the structure 300. It should be noted that while only a single interconnect level is shown, the structure 300 may have multiple interconnect levels above and below the $M_x$ level 302. Also, the first and second $M_x$ metals 306, 308 may serve as the electrodes of an anti-fuse structure.

The first $M_x$ metal 306 and the second $M_x$ metal 308 may be formed in the $M_x$ dielectric 304 in accordance with typical photolithographic techniques. The first and second $M_x$ metals 306, 308 may consist of a typical line or wire found in a typical semiconductor circuit. The first and second $M_x$ metals 306, 308 may be fabricated using, for example, a typical single damascene technique in which a conductive interconnect material may be deposited in a trench formed in the $M_x$ dielectric 304. In one embodiment, the first and second $M_x$ metals 306, 308 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited using a physical vapor deposition technique prior to filling the trench.

Figure 3B:
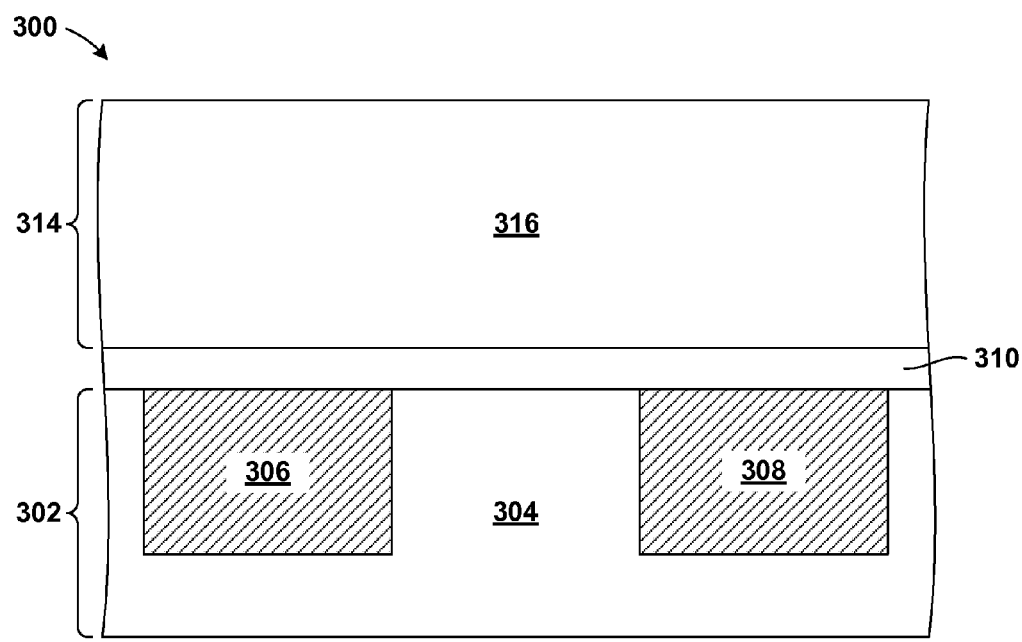

Referring now to FIG. 3B, a dielectric layer 310 may be deposited over the $M_x$ level 302. The dielectric layer 310 may electrically insulate the $M_x$ level 302 from additional interconnect levels that may be subsequently formed above the $M_x$ level 302. The dielectric layer 310 may be deposited using typical deposition techniques, for example, chemical vapor deposition. The dielectric layer 310 may include, for example, $Si_3N_4$, SiC, SiCN, SiCH, SiCON, $SiO_2$, or other known dielectric materials. The dielectric layer 310 may have a thickness ranging from about 60 nm to about 140 nm and ranges there between, although a thickness less than 60 nm and greater than 140 nm may be acceptable. In one embodiment, the dielectric layer 310 may include a capping layer preferably containing nitrogen.

An $M_{x+1}$ level 314 located above the $M_x$ level 302 may be formed above the dielectric layer 310. The $M_{x+1}$ level 314 may include an $M_{x+1}$ dielectric 316. Like the $M_x$ dielectric 304, the $M_{x+1}$ dielectric 316 may be, for example, $SiO_2$, $Si_3N_4$, SiCOH, SiLK, or porous dielectrics. It should be noted that while only two interconnect levels are shown, the structure 300 may have multiple interconnect levels above the $M_{x+1}$ level 314 and below the $M_x$ level 302.

Figure 3C:
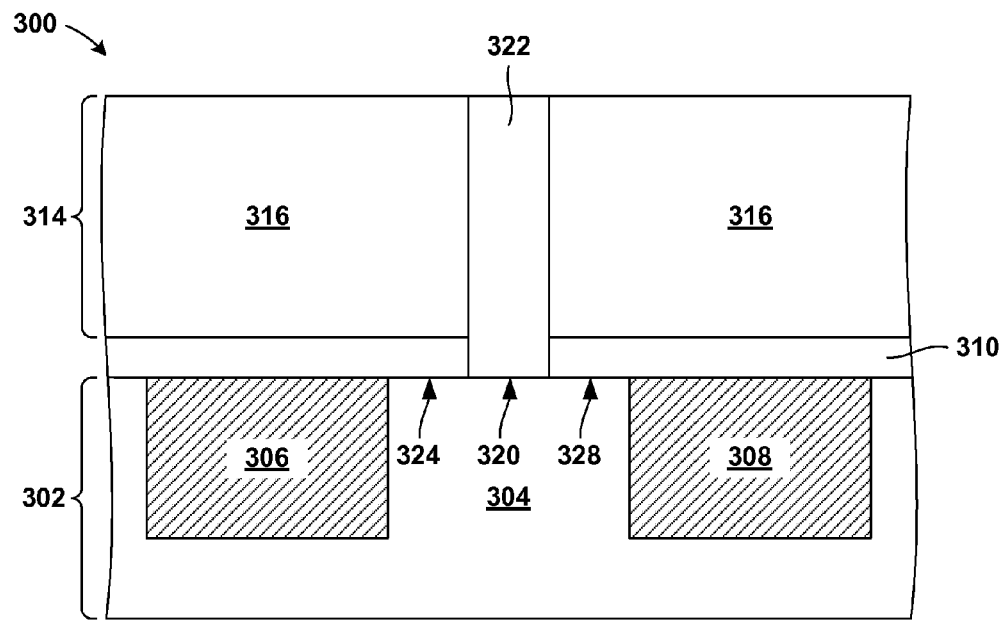

Referring now to FIG. 3C, a via interconnect 322 may be formed in the $M_{x+1}$ level 316. The via interconnect 322 may be formed using typical photolithographic techniques, and may be located about half way between the first and second $M_x$ metals 306, 308, as shown in the figure. In one embodiment, the via interconnect 322 may be positioned anywhere between the first and second $M_x$ metals 306, 308, so long as the via interconnect 322 remains eclectically insulated from the first and second $M_x$ metals 306, 308 prior to programming. The via interconnect 322 may extend into the $M_x$ dielectric 304, but preferably stop at an interface 320 between the $M_x$ level 302 and the dielectric layer 310. The via interconnect 322 may then be subsequently filled with a conductive material. In one embodiment, the via interconnect 322 may include various barrier liners (not shown). One barrier liner may include, for example, TaN, followed by an additional layer including Ta. Like the first and second $M_x$ metals 306, 308, the conductive material may include, for example, Cu, Al, or W. The conductive material may be formed using a filling technique such as electroplating, electroless plating, chemical vapor deposition, physical vapor deposition or a combination of methods. A seed layer (not shown) may optionally be deposited using a physical vapor deposition technique prior to filling the trench. The structure 300 depicted in FIG. 3C represents the final anti-fuse structure prior to programming. The via interconnect 322 may be referred to as a metallic element.

Figure 3D:
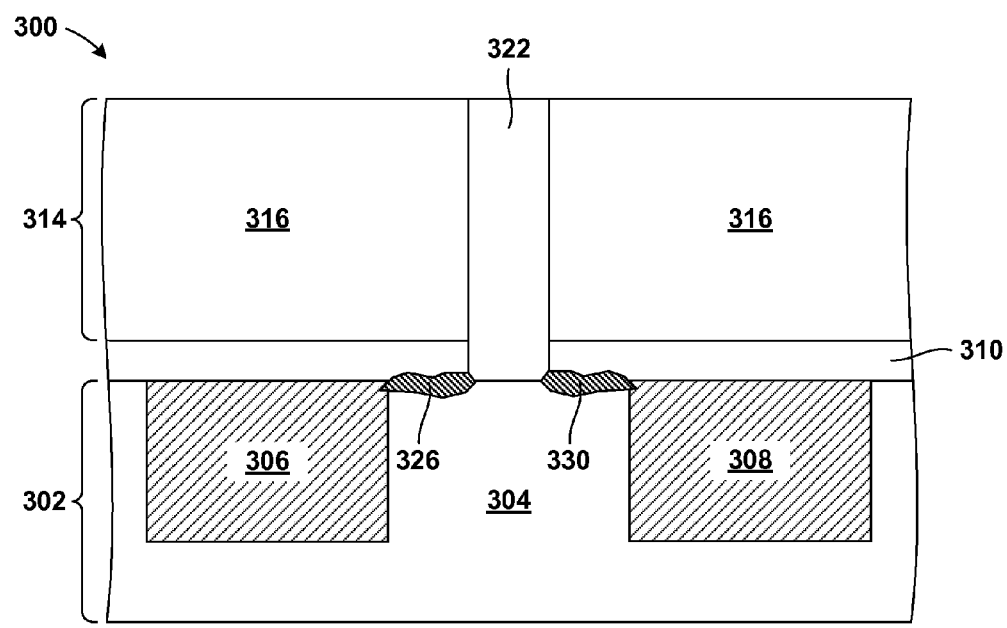

Now referring to FIG. 3D, the final anti-fuse structure is shown after programming. The anti-fuse structure maybe programmed one of three ways. In the first programming scenario, the anti-fuse structure maybe programmed by applying a programming voltage to either the via interconnect 322 or the first $M_x$ metal 306 and grounding the other. The necessary programming voltage may range from about 1 V to about 10 V, and have a current ranging from about 2 mA to about 10 mA. As a result, the conductive material of the first $M_x$ metal 306 or the via interconnect 322 may migrate along an interface 324 (shown in FIG. 3C) between the $M_x$ dielectric 304 and the dielectric layer 310. The migration of the conductive material may form a conductive link 326 between the first $M_x$ metal 306 and the via interconnect 322. The conductive link 326 may have a thickness ranging from about 5 nm to about 10 nm and ranges there between, and more preferably less than the thickness of the dielectric layer 310. The length of the conductive link 326 may be about equal to the breakdown distance of the anti-fuse structure. The conductive link 326 may form an electrical connection between the first $M_x$ metal 306 and the via interconnect 322. Because the interface 324 may be inherently weak and the breakdown spacing may be greatly reduced a lower programming current may be used. Also, programming times may be reduced as a direct result of decreasing the breakdown distance.

Alternatively, in the second programming scenario, the anti-fuse structure may be programmed by applying a programming voltage to either the via interconnect 322 or the second $M_x$ metal 308 and grounding the other. Thus, causing the formation of a conductive link 330 along an interface 328 (shown in FIG. 3C). Similar programming voltages and currents as applied in the first programming scenario may apply in the second programming scenario. The conductive link 330 may have similar physical characteristics as the conductive link 326. It should be noted that both the first and second programming scenarios described above are depicted in FIG. 3D, and programming the anti-fuse structure according to either the first or second programming scenario may result in either the conductive link 326 or the conductive link 330. Therefore, programming the anti-fuse structure according to either the first or second programming scenario may result in the formation of only one conductive link.

Furthermore, a third programming scenario may be envisioned. The third programming scenario may include programming the anti-fuse structure by applying a programming voltage to either the first $M_x$ metal 306 or the second $M_x$ metal 308 and grounding the other. Therefore, programming the anti-fuse structure according to the third scenario may result in the formation of both the conductive link 326 and the conductive link 330. Similar programming voltages and currents as applied in the first programming scenario may apply in the third programming scenario.

With continued reference to FIG. 3D, assuming the breakdown distance of a typical anti-fuse structure is equal to the distance between the first $M_x$ metal 306 to the second $M_x$ metal 308, the addition of the via interconnect 322 effectively reduces the typical breakdown distance. Based on typical 22 nm ground rules, the minimum distance between the first and second $M_x$ metals 306, 308 may be about 40 nm, however the dimensions will scale accordingly for different technology nodes, and the given dimensions are just examples. Therefore, the effective breakdown distance of a typical anti-fuse structure would be equal to the distance between the first and second $M_x$ metals 306, 308, or about 40 nm. After the addition of the via interconnect 322 and based on the first and second programming scenarios, the effective breakdown distance may be the distance between the first $M_x$ metal 306 and the via interconnect 322, or the distance between the via interconnect 322 and the second $M_x$ metal 308. After the addition of the via interconnect 322 and based on the third programming scenario, the effective breakdown distance may be the sum of the distances between the first $M_x$ metal 306 and the via interconnect 322 and between the second $M_x$ metal 308 and the via interconnect. The addition of the via interconnect 322 may reduce the breakdown distance by about 20% to about 80%. For example, the 40 nm breakdown distance may be reduced to a breakdown distance in the range of about 8 nm to about 32 nm depending on the programming scenario chosen. Therefore, the distance between the first $M_x$ metal 306 and the via interconnect 322, or the distance between the via interconnect 322 and the second $M_x$ metal 308 may range from about 8 nm to about 32 nm. Alternatively, the sum of the distances between the first $M_x$ metal 306 and the via interconnect 322 and between the second $M_x$ metal 308 and the via interconnect 322 may range from about 8 nm to about 32 nm. Preferably, the breakdown distance may be such to yield a programming current of about 5 mA.

It may be understood by a person having ordinary skill in the art that the via interconnect 322 may have a minimum width of about 40 nm according to typical 22 nm ground rules. Therefore, the distance between the first and second $M_x$ metals 306, 308 must be such that some space remains between the via interconnect 322 and either of the first or second $M_x$ metals 306, 308, and no electrical connection is formed prior to programming. In other words the first and second $M_x$ metals 306, 308 of the anti-fuse structure may be spaced greater than 40 nm apart for 22 nm nodes. It should be noted the dimensions will scale accordingly for different technology nodes, and the given dimensions are just examples.

Another method by which to reduce the effective breakdown spacing is described in detail below by referring to the accompanying drawings FIGS. 4A-4F. It may be understood by a person having ordinary skill in the art that while only two $M_x$ metals are depicted in the following set of drawings a single chip may include more than two $M_x$ metals.

Figure 4A:
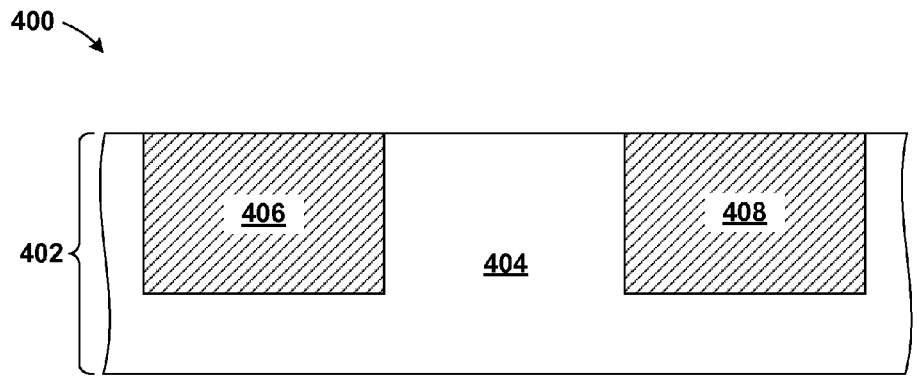
FIGS. 4A-4F illustrate the steps of a method of forming an anti-fuse structure according to an exemplary embodiment.

Referring now to FIG. 4A, a structure 400 is shown. The structure 400 may include an $M_x$ level 402. The $M_x$ level 402 may include an $M_x$ dielectric 404, a first $M_x$ metal 406, and a second $M_x$ metal 408. The $M_x$ dielectric 404 may be, for example, $SiO_2$, $Si_3N_4$, SiCOH, SiLK, or porous dielectrics. The $M_x$ level 402 may be any interconnect level in the structure 400. It should be noted that while only a single interconnect level is shown, the structure 400 may have multiple interconnect levels above and below the $M_x$ level 402. Also, the first and second $M_x$ metals 406, 408 may serve as the electrodes of an anti-fuse structure.

The first $M_x$ metal 406 and the second $M_x$ metal 408 may be formed in the $M_x$ dielectric 404 in accordance with typical photolithographic techniques. The first and second $M_x$ metals 406, 408 may consist of a typical line or wire found in a typical semiconductor circuit. The first and second $M_x$ metals 406, 408 may be fabricated using, for example, a typical single damascene technique in which a conductive interconnect material may be deposited in a trench formed in the $M_x$ dielectric 404. In one embodiment, the first and second $M_x$ metals 406, 408 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited using a physical vapor deposition technique prior to filling the trench.

Figure 4B:
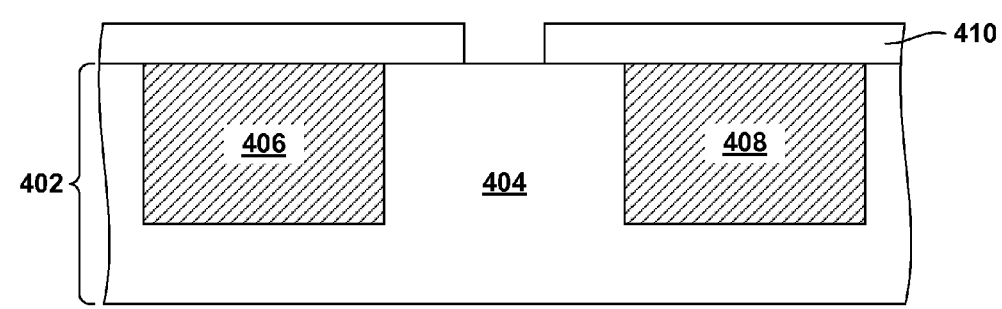

Referring now to FIG. 4B, a dielectric layer 410 may be deposited over the $M_x$ level 402. The dielectric layer 410 may electrically insulate the $M_x$ level 402 from additional interconnect levels (not shown) that may be subsequently formed above the $M_x$ level 402. The dielectric layer 410 may be deposited using typical deposition techniques, for example, chemical vapor deposition. The dielectric layer 410 may include, for example, $Si_3N_4$, SiC, SiCN, SiCH, SiCON, $SiO_2$, or other known dielectric materials. The dielectric layer 410 may have a thickness ranging from about 60 nm to about 140 nm and ranges there between, although a thickness less than 60 nm and greater than 140 nm may be acceptable. In one embodiment, the dielectric layer 410 may include a capping layer preferably containing nitrogen. A portion of the dielectric layer 410 may be selectively removed from above the $M_x$ dielectric 404 using known removal techniques. The portion of the dielectric layer 410 being removed may be located about half way between the first and second $M_x$ metals 406, 408, as shown in the figure. In one embodiment, the portion of the dielectric layer 410 being removed may be positioned anywhere between the first and second $M_x$ metals 406, 408, so long as no portion of either the first or second $M_x$ metals 406, 408 is exposed due to the removal of the portion of the dielectric layer 410.

Figure 4C:
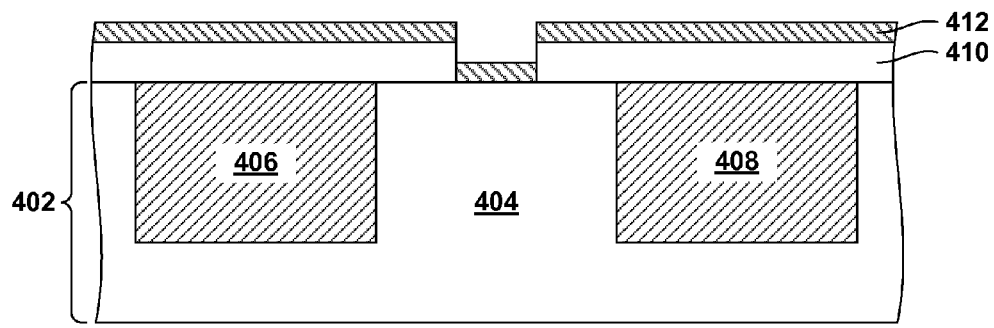

Referring now to FIG. 4C, next a metallic layer 412 may be deposited above the dielectric layer 410 and the $M_x$ dielectric 404. The metallic layer 412 may be deposited using typical deposition techniques, for example, chemical vapor deposition. The metallic layer 412 may include, for example, W, Al, Ti, Co, or graphene or other metals. The metallic layer 412 may have a thickness ranging from about 1 nm to about 10 nm and ranges there between, although a thickness less than 1 nm and greater than 10 nm may be acceptable. In one embodiment the metallic layer 412 may include Ti and be 8 nm thick. The metallic layer 412 may be referred to as a metallic element.

Figure 4D:
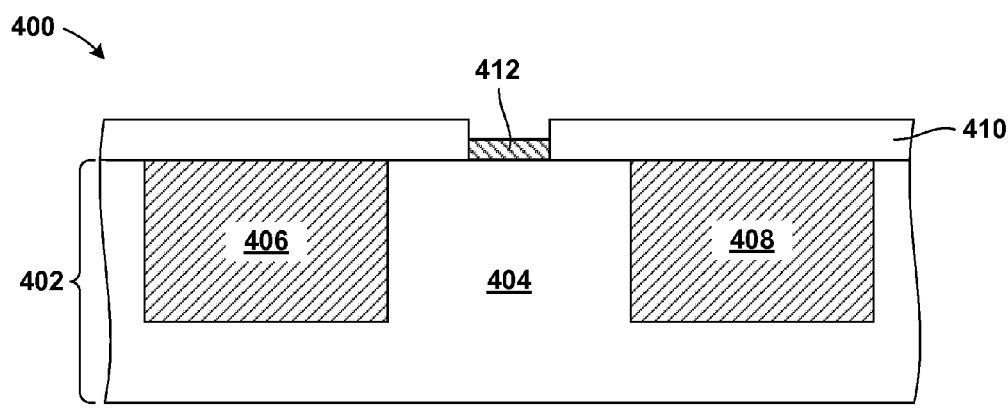

Referring now to FIG. 4D, a portion of the metallic layer 412 directly above the dielectric layer 410 may be selectively removed from above the dielectric layer 410 using known removal techniques. Selective etch chemistries, for example $O_2$, may be use to remove the metallic layer 412 from above the dielectric layer 410. The metallic layer 412 may remain above the $M_x$ dielectric 404.

It may be understood by a person having ordinary skill in the art that a combination of positive and negative photoresists may be used to remove the portion of the dielectric layer 410 and the portion of the metallic layer 412. If a positive photoresist is used to remove the portion of the dielectric layer 410 the same mask may be used to develop a negative photoresist to remove the portion of the metallic layer 412, and vice versa. A positive or negative photoresist may be used to remove both the portion of the dielectric layer 410 and the portion of the metallic layer 412, but may require the use of two different masks.

Figure 4E:
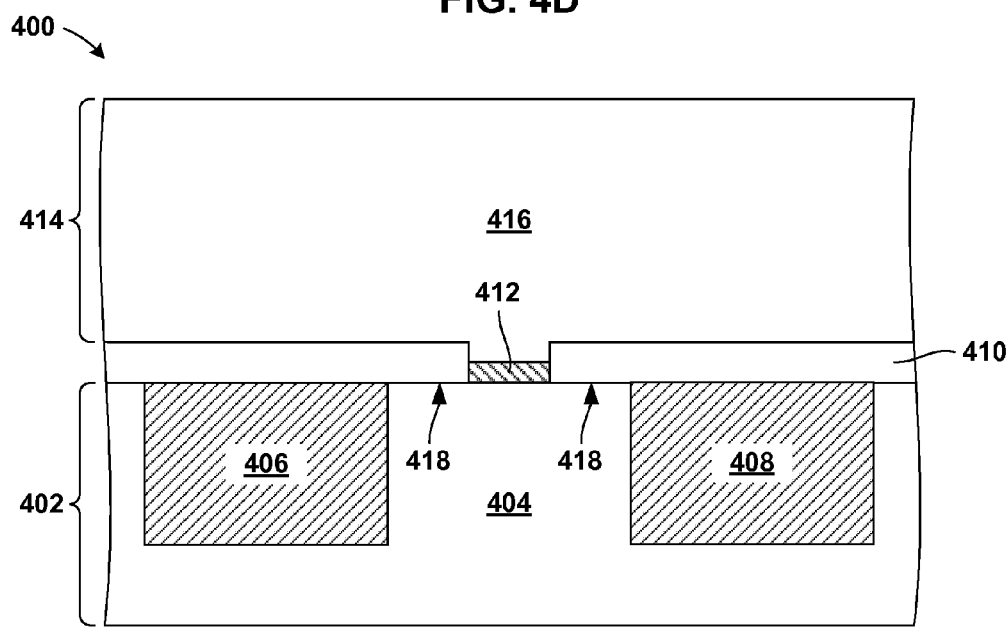

Referring now to FIG. 4E, an $M_{x+1}$ level 414 located above the $M_x$ level 402 is shown. The $M_{x+1}$ level 414 may include an $M_{x+1}$ dielectric 416. Like the $M_x$ dielectric 404, the $M_{x+1}$ dielectric 416 may be, for example, $SiO_2$, $Si_3N_4$, SiCOH, SiLK, or porous dielectrics. It should be noted that while only two interconnect levels are shown, the structure 400 may have multiple interconnect levels above the $M_{x+1}$ level 414 and below the $M_x$ level 402.

Figure 4F:
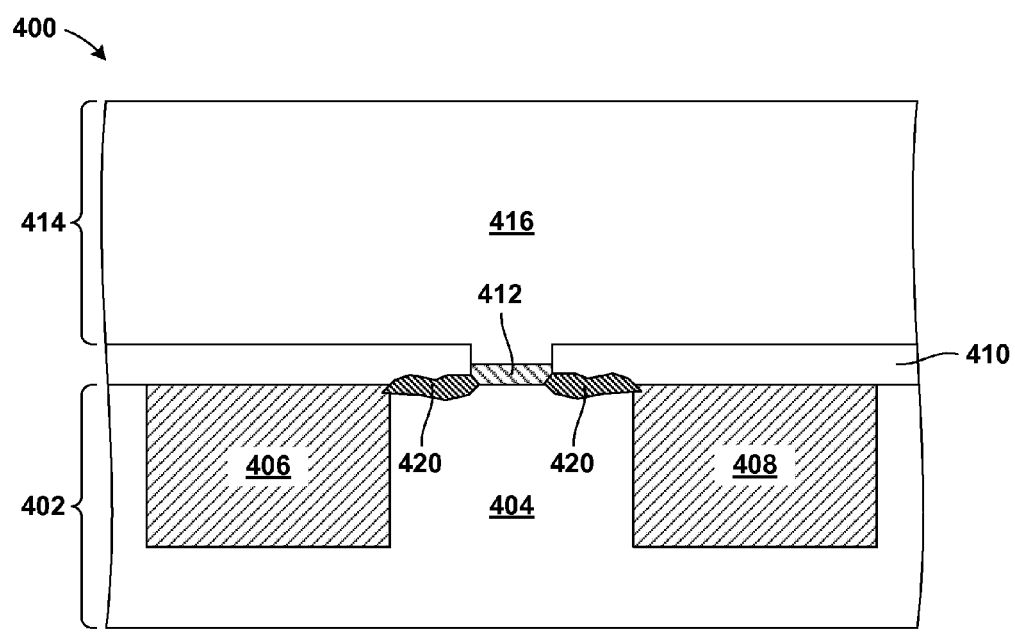

Now referring to FIG. 4F, the final anti-fuse structure is shown after programming. The anti-fuse structure maybe programmed by applying a programming voltage to either the first or second $M_x$ metals 406, 408 and grounding the other $M_x$ metal. The necessary programming voltage may range from about 1 V to about 10 V, and have a current ranging from about 2 mA to about 10 mA. As a result, the conductive material of the first and second $M_x$ metals 406, 408 may migrate along the interface 418 (shown in FIG. 4E) between the $M_x$ dielectric 404 and the dielectric layer 410. The migration of the conductive material of the first and second $M_x$ metals 406, 408 may form a conductive link 420 between both $M_x$ metals 406, 408 and the metallic layer 412. The conductive link 420 may have a thickness ranging from about 5 nm to about 10 nm and ranges there between, and more preferably less than the thickness of the dielectric layer 410. The length of the conductive link 420 may be about equal to the breakdown distance of the anti-fuse structure. The conductive link 420 may form an electrical connection between both $M_x$ metals 406, 408 and the metallic layer 412. Because the interface 418 may be inherently weak and the breakdown spacing may be greatly reduced a lower programming current may be used. Also, programming times may be reduced as a direct result of decreasing the breakdown distance.

With continued reference to FIG. 4F, assuming the breakdown distance of a typical anti-fuse structure is equal to the distance between the first $M_x$ metal 406 to the second $M_x$ metal 408, the addition of the metallic layer 412 effectively reduces the breakdown distance. Based on typical 22 nm ground rules, the minimum distance between the first and second $M_x$ metals 406, 408 may be about 40 nm, however the dimensions will scale accordingly for different technology nodes, and the given dimensions are just examples. Therefore, the effective breakdown distance of a typical anti-fuse structure would be equal to the distance between the first and second $M_x$ metals 406, 408, or about 40 nm. After the addition of the metallic layer 412 the effective breakdown distance may be the sum of the distances between the first $M_x$ metal 406 and the metallic layer 412 and between the second $M_x$ metal 408 and the metallic layer 412. The addition of the metallic layer 412 may reduce the breakdown distance by about 20% to about 80%. For example, the 40 nm breakdown distance may be reduced to a breakdown distance in the range of about 8 nm to about 32 nm. Therefore, the sum of the distances between the first $M_x$ metal 406 and the metallic layer 412, and between the second $M_x$ metal 408 and the metallic layer 412 may range from about 8 nm to about 32 nm. Preferably, the breakdown distance may be such to yield a programming current of about 5 mA.

It may be understood by a person having ordinary skill in the art that the metallic layer 412 may have a minimum width of 40 nm according to typical 22 nm ground rules. Therefore, the distance between the first and second $M_x$ metals 406, 408 must be such that some space remains between the metallic layer 412 and either of the first or second $M_x$ metals 406, 408, and no electrical connection is formed prior to programming. In other words the first and second $M_x$ metals 406, 408 of the anti-fuse structure may be spaced greater than 40 nm apart for 22 nm nodes. It should be noted the dimensions will scale accordingly for different technology nodes, and the given dimensions are just examples.

Another method by which to reduce the effective breakdown spacing is described in detail below by referring to the accompanying drawings FIGS. 5A-5G. It may be understood by a person having ordinary skill in the art that while only two $M_x$ metals are depicted in the following set of drawings a single chip may include more than two $M_x$ metals.

Figure 5A:
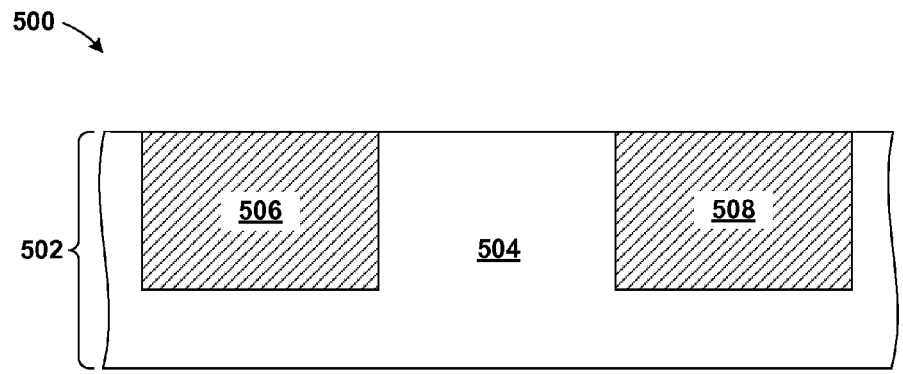
FIGS. 5A-5G illustrate the steps of a method of forming an anti-fuse structure according to an exemplary embodiment.

Referring now to FIG. 5A, a structure 500 is shown. The structure 500 may include an $M_x$ level 502. The $M_x$ level 502 may include an $M_x$ dielectric 504, a first $M_x$ metal 506, and a second $M_x$ metal 508. The $M_x$ dielectric 504 may be, for example, $SiO_2$, $Si_3N_4$, SiCOH, SiLK, or porous dielectrics. The $M_x$ level 502 may be any interconnect level in the structure 500. It should be noted that while only a single interconnect level is shown, the structure 500 may have multiple interconnect levels above and below the $M_x$ level 502. Also, the first and second $M_x$ metals 506, 508 may serve as the electrodes of an anti-fuse structure.

The first $M_x$ metal 506 and the second $M_x$ metal 508 may be formed in the $M_x$ dielectric 504 in accordance with typical photolithographic techniques. The first and second $M_x$ metals 506, 508 may consist of a typical line or wire found in a typical semiconductor circuit. The first and second $M_x$ metals 506, 508 may be fabricated using, for example, a typical single damascene technique in which a conductive interconnect material may be deposited in a trench formed in the $M_x$ dielectric 504. In one embodiment, the first and second $M_x$ metals 506, 508 may include various barrier liners (not shown). One barrier liner may include, for example, TaN, followed by an additional layer including Ta. The conductive interconnect material may include, for example, Cu, Al, or W. The conductive interconnect material may be formed using a filling technique such as electroplating, electroless plating, chemical vapor deposition, physical vapor deposition or a combination of methods. A seed layer (not shown) may optionally be deposited using a physical vapor deposition technique prior to filling the trench.

Figure 5B:
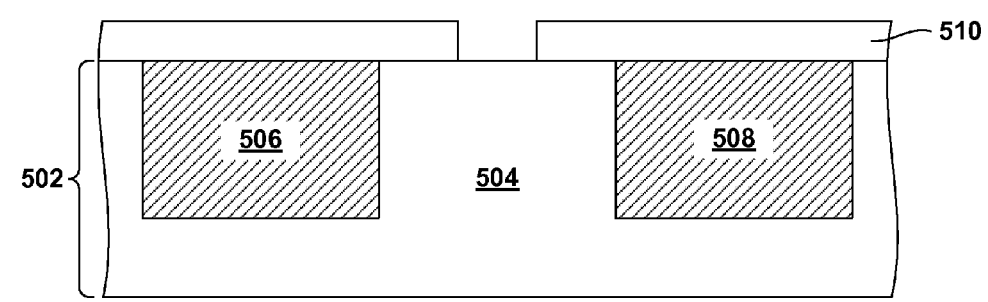

Referring now to FIG. 5B, a dielectric layer 510 may be deposited over the $M_x$ level 502. The dielectric layer 510 may electrically insulate the $M_x$ level 502 from additional interconnect levels (not shown) that may be subsequently formed above the $M_x$ level 502. The dielectric layer 510 may be deposited using typical deposition techniques, for example, chemical vapor deposition. The dielectric layer 510 may include, for example, $Si_3N_4$, SiC, SiCN, SiCH, SiCON, $SiO_2$, or other known dielectric materials. The dielectric layer 510 may have a thickness ranging from about 60 nm to about 140 nm and ranges there between, although a thickness less than 60 nm and greater than 140 nm may be acceptable. In one embodiment, the dielectric layer 510 may include a capping layer preferably containing nitrogen. A portion of the dielectric layer 510 may be selectively removed from above the $M_x$ dielectric 504 using known removal techniques. The portion of the dielectric layer 510 being removed may be located about half way between the first and second $M_x$ metals 506, 508, as shown in the figure. In one embodiment, the portion of the dielectric layer 510 being removed may be positioned anywhere between the first and second $M_x$ metals 506, 508, so long as no portion of either the first or second $M_x$ metals 506, 508 is exposed due to the removal of the portion of the dielectric layer 510.

Figure 5C:
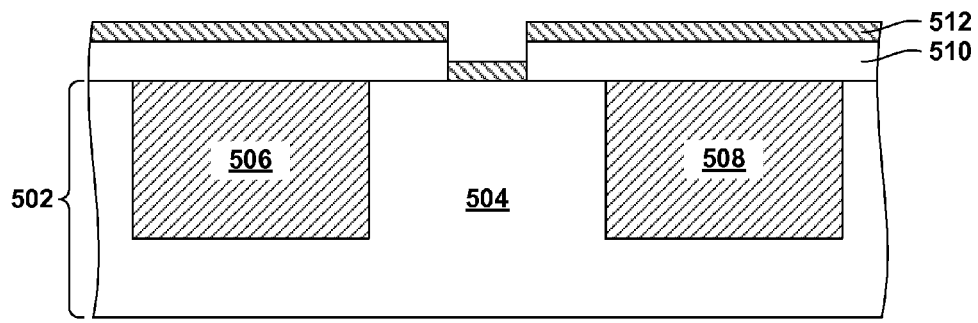

Referring now to FIG. 5C, next a metallic layer 512 may be deposited above the dielectric layer 510 and the $M_x$ dielectric 504. The metallic layer 512 may be deposited using typical deposition techniques, for example, chemical vapor deposition. The metallic layer 512 may include, for example, W, Al, Ti, Co, or graphene or other metals. The metallic layer 512 may have a thickness ranging from about 1 nm to about 10 nm and ranges there between, although a thickness less than 1 nm and greater than 10 nm may be acceptable. In one embodiment the metallic layer 512 may include Ti and be 8 nm thick.

Figure 5D:
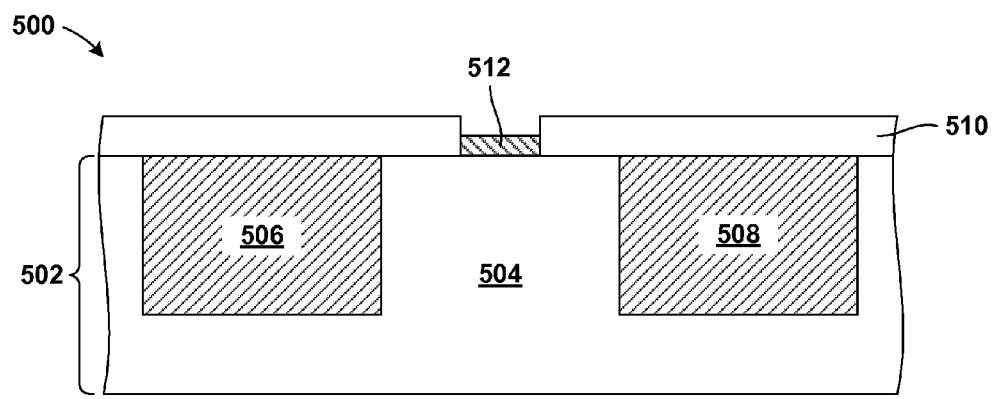

Referring now to FIG. 5D, a portion of the metallic layer 512 directly above the dielectric layer 510 may be selectively removed from above the dielectric layer 510 using known removal techniques. Selective etch chemistries, for example $O_2$, may be use to remove the metallic layer 512 from above the dielectric layer 510. The metallic layer 512 may remain above the dielectric layer 504.

It may be understood by a person having ordinary skill in the art that a combination of positive and negative photoresists may be used to remove the portion of the dielectric layer 510 and the portion of the metallic layer 512. If a positive photoresist is used to remove the portion of the dielectric layer 510 the same mask may be used to develop a negative photoresist to remove the portion of the metallic layer 512, and vice versa. A positive or negative photoresist may be used to remove both the portion of the dielectric layer 510 and the portion of the metallic layer 512, but may require the use of two different masks.

Figure 5E:
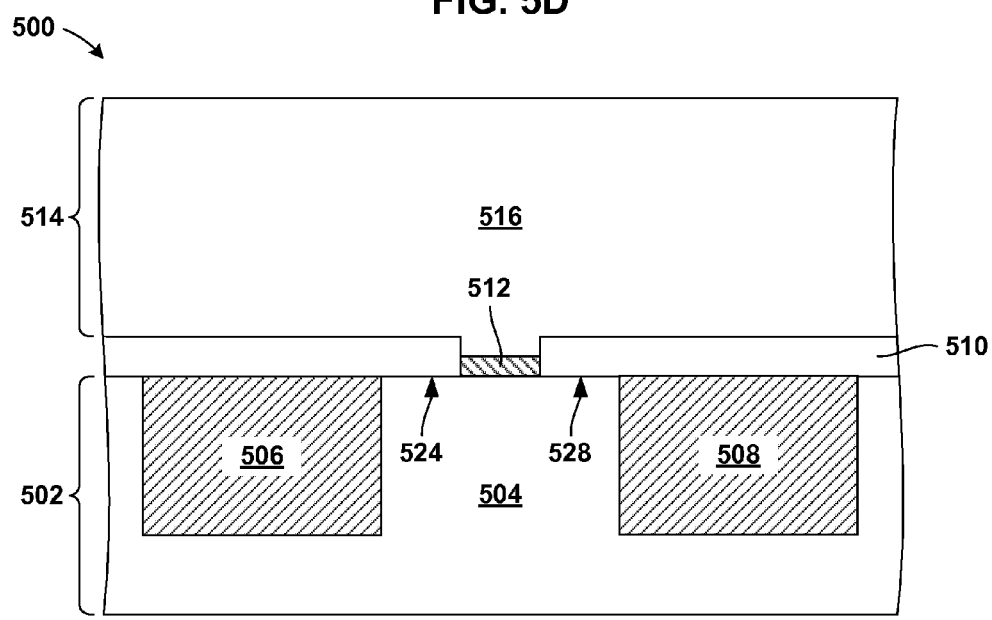

Referring now to FIG. 5E, an $M_{x+1}$ level 514 located above the $M_x$ level 502 is shown. The $M_{x+1}$ level 514 may include an $M_{x+1}$ dielectric 516. Like the $M_x$ dielectric 504, the $M_{x+1}$ dielectric 516 may be, for example, $SiO_2$, $Si_3N_4$, SiCOH, SiLK, or porous dielectrics. It should be noted that while only two interconnect levels are shown, the structure 500 may have multiple interconnect levels above the $M_{x+1}$ level 514 and below the $M_x$ level 502.

Figure 5F:
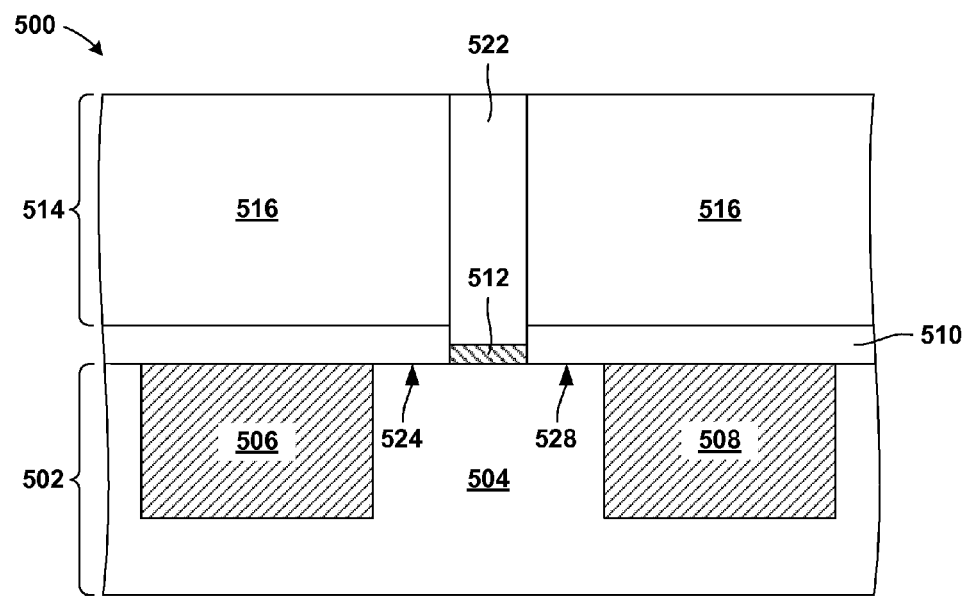

Now referring to FIG. 5F, a via interconnect 522 may be formed in the $M_{x+1}$ level 516, and be substantially aligned with the metallic later 512. The metallic layer 512 may serve as an etch stop when forming a via. The via may then be subsequently filled with a conductive material to form the via interconnect 522. In one embodiment, the via interconnect 522 may include various barrier liners (not shown). One barrier liner may include, for example, TaN, followed by an additional layer including Ta. Like the first and second $M_x$ metals 506, 508, the conductive material may include, for example, Cu, Al, or W. The conductive material may be formed using a filling technique such as electroplating, electroless plating, chemical vapor deposition, physical vapor deposition or a combination of methods. A seed layer (not shown) may optionally be deposited using a physical vapor deposition technique prior to filling the trench. The metallic layer 512 and the via interconnect 522 may be referred to collectively as a metallic element.

Figure 5G:
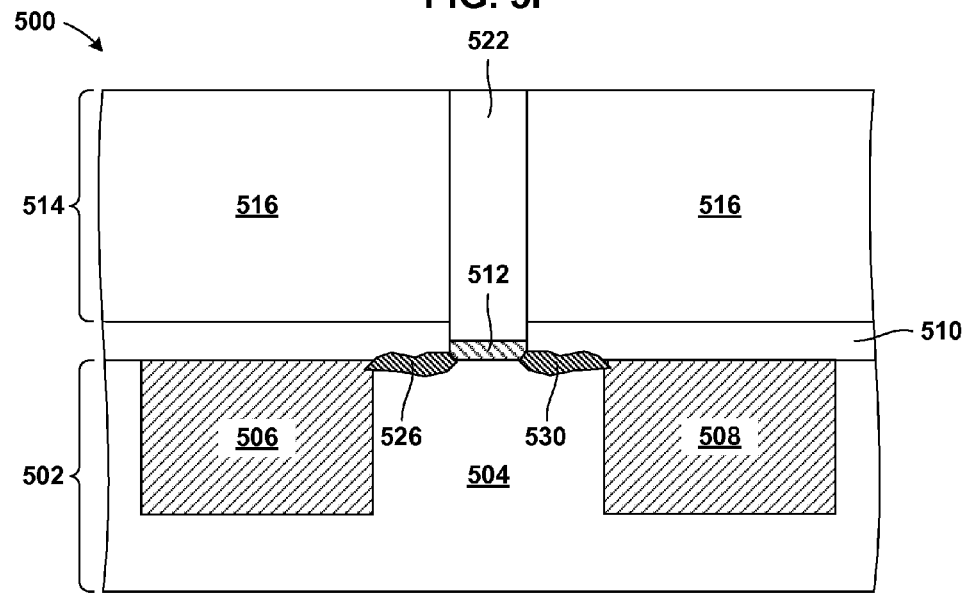

Now referring to FIG. 5G, the final anti-fuse structure is shown after programming. The anti-fuse structure maybe programmed one of three ways. In the first programming scenario, the anti-fuse structure maybe programmed by applying a programming voltage to either the via interconnect 522 or the first $M_x$ metal 506 and grounding the other. The necessary programming voltage may range from about 1 V to about 10 V, and have a current ranging from about 2 mA to about 10 mA. As a result, the conductive material of the first $M_x$ metal 506 or the metallic layer 512 may migrate along an interface 524 (shown in FIGS. 5E & 5F) between the $M_x$ dielectric 504 and the dielectric layer 510. The migration of the conductive material may form a conductive link 526 between the first $M_x$ metal 506 and the metallic layer 512. The conductive link 526 may have a thickness ranging from about 5 nm to about 10 nm and ranges there between, and more preferably less than the thickness of the dielectric layer 510. The length of the conductive link 526 may be about equal to the breakdown distance of the anti-fuse structure. The conductive link 526 may form an electrical connection between the first $M_x$ metal 506 and the metallic layer 512. Because the interface 524 may be inherently weak and the breakdown spacing may be greatly reduced a lower programming current may be used. Also, programming times may be reduced as a direct result of decreasing the breakdown distance.

Alternatively, in the second programming scenario, the anti-fuse structure may be programmed by applying a programming voltage to either the via interconnect 522 or the second $M_x$ metal 508 and grounding the other. Thus, causing the formation of a link 530 along an interface 528 (shown in FIGS. 5E & 5F). Similar programming voltages and currents as applied in the first programming scenario may apply in the second programming scenario. The conductive link 530 may have similar physical characteristics as the conductive link 526. It should be noted that the first and second programming scenarios described above are shown in FIG. 5G, and programming the anti-fuse structure according to either the first or second programming scenario may result in either the link 526 or the link 530. Therefore, programming the anti-fuse structure according to either the first or second programming scenario may result in the formation of only one link.

Furthermore, a third programming scenario may be envisioned. The third programming scenario may include programming the anti-fuse structure by applying a programming voltage to either the first $M_x$ metal 506 or the second $M_x$ metal 508 and grounding the other. Therefore, programming the anti-fuse structure according to the third scenario may result in the formation of both the link 526 and the link 530. Similar programming voltages and currents as applied in the first programming scenario may apply in the third programming scenario.

With continued reference to FIG. 5G, assuming the breakdown distance of a typical anti-fuse structure is equal to the distance between the first $M_x$ metal 506 to the second $M_x$ metal 508, the addition of the metallic layer 512 effectively reduces the breakdown distance. Based on typical 22 nm ground rules, the minimum distance between the first and second $M_x$ metals 506, 508 may be about 40 nm, however the dimensions will scale accordingly for different technology nodes, and the given dimensions are just examples. Therefore, the effective breakdown distance of a typical anti-fuse structure would be equal to the distance between the first and second $M_x$ metals 506, 508, or about 40 nm. After the addition of the metallic layer 512 and based on the first and second programming scenarios, the effective breakdown distance may be the distance between the first $M_x$ metal 506 and the metallic layer 512, or the distance between the metallic layer 512 and the second $M_x$ metal 508. After the addition of the metallic layer 512 and based on the third programming scenario, the effective breakdown distance may be the sum of the distances between the first $M_x$ metal 506 and the metallic layer 512 and between the second $M_x$ metal 508 and the metallic layer 512. The addition of the metallic layer 512 may reduce the breakdown distance by about 20% to about 80%. For example, the 40 nm breakdown distance may be reduced to a breakdown distance in the range of about 8 nm to about 32 nm depending on the programming scenario chosen. Therefore, the distance between the first $M_x$ metal 506 and the metallic layer 512, or the distance between the metallic layer 512 and the second $M_x$ metal 508 may range from about 8 nm to about 32 nm. Alternatively, the sum of the distances between the first $M_x$ metal 506 and the metallic layer 512, and between the second $M_x$ metal 508 and the metallic layer 512 may range from about 8 nm to about 32 nm. Preferably, the breakdown distance may be such to yield a programming current of about 5 mA.

It may be understood by a person having ordinary skill in the art that the metallic layer 512 may have a minimum width of 40 nm according to typical 22 nm ground rules. Therefore, the distance between the first and second $M_x$ metals 506, 508 must be such that space remains between the metallic layer 512 and the first and second $M_x$ metals 506, 508, and no electrical connection is formed prior to programming. In other words the first and second $M_x$ metals 506, 508 of the anti-fuse structure may be spaced greater than 40 nm apart for 22 nm nodes. It should be noted the dimensions will scale accordingly for different technology nodes, and the given dimensions are just examples. In addition, the placement of the metallic layer 512 between the first and second $M_x$ metals 506, 508 may be such that the metallic layer 512 is equidistant between the first and second $M_x$ metals 506, 508. Or the placement of the metallic layer 512 between the first and second $M_x$ metals 506, 508 may be such that the metallic layer 512 is closer to the first and $M_x$ metal 506 rather than the second $M_x$ metal 508. Or the placement of the metallic layer 512 between the first and second $M_x$ metals 506, 508 may be such that the metallic layer 512 is farther from the first and $M_x$ metal 506 as compared to the second $M_x$ metal 508.

The previously described embodiments of the present invention have many advantages, including easy process flow integration, operability at low on chip supply voltages, and high programming reliability. These advantages may be achieved by reducing the effective breakdown distance. Furthermore, improved programming reliability may be achieved by providing multiple conductive link paths. It should be noted that not all advantageous features need to be incorporated into all embodiments of the present invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. An electronic anti-fuse structure, the structure comprising:
    an $M_x$ level comprising a first $M_x$ metal and a second $M_x$ metal;
    a dielectric layer located above the $M_x$ level;
    an $M_{x+1}$ level located above the dielectric layer; and
    a metallic element in the dielectric layer and positioned between the first $M_x$ metal and the second $M_x$ metal, wherein the metallic element is insulated from both the first $M_x$ metal and the second $M_x$ metal; and
    a conductive link located along an interface between the $M_x$ level and the dielectric layer, the conductive link being located between the metallic element and the first $M_x$ metal.

2. The structure of claim 1, wherein the metallic element is a via interconnect extending through the $M_{x+1}$ level and the dielectric layer to an interface between the $M_x$ level and the dielectric layer.

3. The structure of claim 1, wherein the metallic element comprises a metallic layer.

4. The structure of claim 3, wherein the metallic element further comprises a via interconnect extending through the $M_{x+1}$ level and the dielectric layer to an interface between the $M_x$ level and the dielectric layer, wherein a bottom of the via interconnect contacts the metallic layer.

5. The structure of claim 3, wherein the metallic layer comprises a material selected from the group consisting W, Al, Ti, Co, and graphene, and an alloy thereof.

6. The structure of claim 3, wherein the metallic layer comprises a thickness ranging from about 1 nm to about 10 nm.

7. The structure of claim 1, wherein the metallic element comprises Cu, Al, or W.

8. The structure of claim 1, wherein the metallic element is equidistance between the first and second $M_x$ metals.

9. The structure of claim 1, wherein the metallic element is closer to the first $M_x$ metal.

10. The structure of claim 1, wherein the metallic element is closer to the second $M_x$ metal.

11. The structure of claim 1, wherein
    the conductive link forms an electrical connection between the metallic element and the first $M_x$ metal.

12. The structure of claim 1, further comprising:
    another conductive link located along an interface between the $M_x$ level and the dielectric layer, the other conductive link being located between the metallic element and the second $M_x$ metal.

13. A method of forming an electronic anti-fuse structure, the method comprising:
    providing an $M_x$ level comprising a first $M_x$ metal and a second $M_x$ metal;
    forming a dielectric layer above the $M_x$ level; and
    forming an $M_{x+1}$ level located above the dielectric layer; and
    forming a metallic element above the $M_x$ level and positioned between the first $M_x$ metal and the second $M_x$ metal, wherein the metallic element is insulated from both the first $M_x$ metal and the second $M_x$ metal; and
    forming a conductive link along an interface between the $M_x$ level and the dielectric layer, the conductive link being located between the metallic element and the first $M_x$ metal causing electricity to pass between the metallic element and the first $M_x$ metal.

14. The method of claim 13, wherein the metallic element is a via interconnect extending through the $M_{x+1}$ level and the dielectric layer to an interface between the $M_x$ level and the dielectric layer.

15. The method of claim 13, wherein the metallic element is a metallic layer.

16. The method of claim 13, wherein the metallic element is a via interconnect extending through the $M_{x+1}$ level and the dielectric layer to an interface between the $M_x$ level and the dielectric layer, the via interconnect comprising a metallic layer situated at a bottom of the via.

17. The method of claim 13, wherein the metallic element comprises a conductive material selected from the group consisting of Cu, Al, and W.

18. The method of claim 13, further comprising:
    forming a second conductive link along an interface between the $M_x$ level and the dielectric layer, the second conductive link being located between the metallic element and the second $M_x$ metal causing electricity to pass between the metallic element and the second $M_x$ metal, wherein electricity can pass between the first $M_x$ metal and the second $M_x$ metal.

* * * * *